Feb. 22, 1966 W. M. ROBINSON 3,236,936

MINIATURE ELECTRICAL COMPONENT WITH PROTECTED TERMINAL-WIRE CONNECTIONS

Filed July 30, 1962

INVENTOR.
*William M. Robinson*
BY
*Paul S. Martin*
ATTORNEY 3,236,936
Patented Feb. 22, 1966

3,236,936

MINIATURE ELECTRICAL COMPONENT WITH PROTECTED TERMINAL-WIRE CONNECTIONS

William M. Robinson, Fairhaven, Mass., assignor to Cornell-Dubilier Electric Corporation, a corporation of Delaware

Filed July 30, 1962, Ser. No. 213,305
6 Claims. (Cl. 174—52)

The present application relates to electrical components and particularly to capacitors.

The following discussion is addressed particularly to encapsulated capacitors inasmuch as the invention has special application to capacitors. However, except where the context may so require, the illustrative disclosure is not to be construed as limiting.

In the manufacture of capacitors, among the various critical problems are the provision of a connection between a terminal wire and a film or foil electrode of the capacitor section. Another problem involves the provision of an insulating case for the capacitor that will exclude deleterious moisture. An object of the present invention resides in the provision of a novel encapsulated component affording vastly improved resistance to mechanical damage, to the moisture-proof characteristics of the encapsulation, and to the terminal connections, where mechanical stresses may be imposed on the leads or terminal wires that extend external of the encapsulated unit.

The illustrative embodiment of the invention includes a wound capacitor unit of the so-called extended-foil type. Terminal wires are joined to the wound section and extend away from the section parallel to each other. A wafer of a tough material such as nylon is disposed adjacent the capacitor section and has holes through which the wires extend. The capacitor section, the wafer and portions of the terminal wires that extend through the wafer to the capacitor section are encapsulated within a hard moisture-excluding insulation that is applied as a coating.

The wafer is extremely tough and, before it is encapsulated, it may readily be twisted and flexed. The encapsulating coating is also quite brittle, separately. However, where the insulating wafer is contained and encapsulated in the same coating that encapsulates the capacitor section, the wafer and the insulating coating are each effective to modify the characteristics of the other. As a result, mechanical stresses imposed on the leads have no tendency to twist or bend the wafer that is separately susceptible to bending and twisting, and the leads have no tendency to crack the encapsulation formed about the capacitor section when the leads are constrained by the encapsulated wafer. Further, the encapsulated wafer adjacent the capacitor section prevents stresses imposed on the external portions of the wire from being applied to the joints between each wire and the foil of the capacitor section. This latter consideration is of special concern where (as in the illustrative embodiment below) very small components are involved, and where the joint between the wire and the section terminal is of a character that is inherently weak mechanically.

In the manufacture of a capacitor of the foregoing construction, as will be seen in the illustrative disclosure which follows, the capacitor section is interposed between the ends of the terminal wires while those wires extend through spaced-apart holes in the insulating wafer, the wires being thereby accurately spaced. While being thus held, joints are made between the ends of the wires and the terminals of the capacitor section. In one form, the joint may be made by electrically welding the wires to the extended foils of the capacitor section, or a soldering operation might be used. However, the connection is made, with spacial advantage, by means of a conductive thermal-setting resin such as conductive epoxy paste. It is clear, accordingly, that the insulating wafer which provides enhanced physical characteristics in the completed unit, is also effective during the fabrication of the unit for supporting the terminal wires with the desired spacing for the capacitor section for providing mechanical protection for the connections between the terminal wires and the capacitor section even before the unit has been encapsulated.

Accordingly, a further aspect of the invention resides in the method of manufacture of capacitors and the like, for facilitating such manufactures and for providing improved mechanical properties of the unit during the fabricating procedure.

The nature of the invention and its various further aspects and features of novelty will be appreciated from the illustrative disclosure that is given in detail below, and from the accompanying drawings which form part of this disclosure. In the drawings.

Figure 1:
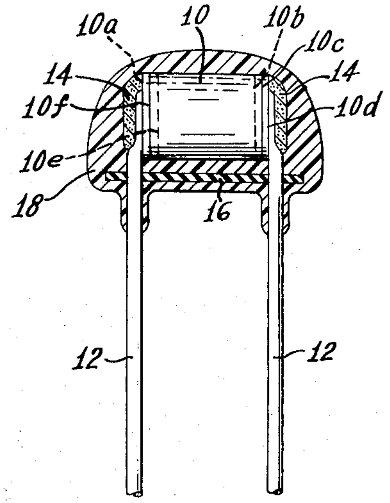
FIG. 1 is an enlarged cross sectional view of a capacitor embodying features of the invention.
Figure 2:
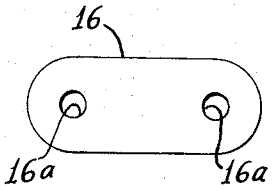
FIG. 2 is an enlarged plan view of a wafer which is shown in section in FIG. 1.
Figure 3:
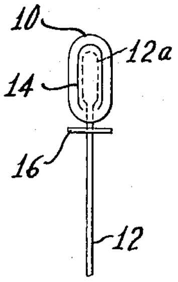
FIG. 3 is an enlarged end view of the components in FIG. 1 prior to encapsulation.
Figure 4:
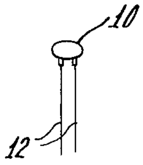
FIG. 4 is an approximately accurate full-size view of a typical capacitor such as that illustrated in FIG. 1.

Referring now to the drawings, a capacitor section 10 is shown having terminals that are connected to lead wires 12 by means of conductive epoxy cement 14. As illustrated in FIG. 3, lead wires 12 have flattened end portions **12*a* that are covered by the conductive cement 14. Capacitor section 10 is of a conventional construction commonly termed "extended-foil" section, wherein two strips of metal foil are concentrically wound, the successive convolutions being separated from each other by wound strips of dielectric material. One strip of foil is shifted axially relative to the other foil and the dielectric strips so that its edge projects at one end of the wound section whereas the other foil has its edge disposed outward of the edges of the dielectric strip at the opposite end of the wound section. The projected foil 10*a* has its opposite edge 10*b* recessed relative to the edge 10*c* of the dielectric material. By like token, the projected foil 10*d* has an inwardly offset edge 10*e* that is recessed relative to the opposite edge 10*f* of the insulating dielectric strip and relative to the projected-foil edge 10*a***. Such wound extended-foil capacitor sections are well-known. They can be made extremely small or miniaturized and have relatively large values of capacitance where the dielectric strips used are of extremely thin material such as 0.00015 Mylar. Where such units are extremely small the customary difficulty of making connection to the foils, which are almost always of aluminum, is made even more difficult. Also, where the capacitor section is extremely small, the possibility of damage resulting from soldering or even from spot-welding may be a problem, but the problem is avoided by use of conductive cement, particularly conductive epoxy cement.

A wafer 16 of insulating material such as nylon is disposed adjacent the capacitor section 10. The lead wires 12 extend through holes **16*a* in the wafer with the flat end portions 12*a* of the wires adjacent the wafer. The wires 12 are tightly held and accurately positioned by the wafer 16. This is extremely useful during the further assembly operation in the maufacture of capacitors since the lead wires 12 are precisely located and snugly accommodate the capacitor section 10 therebetween. The wafer 16 is tough i.e., strong but flexible and not brittle. The thickness of the wafer relative to its width and length is selected so that it is relatively inextensible. Once the capacitor body has been positioned between the opposed lead ends 12***a* the previously described conductive epoxy cement 14 is applied to physically and electrically bond the lead wires to the opposed ends of the capacitor section 10.

The capacitor section 10, lead wires 12, and wafer 16 are then united into a mechanically strong and hermetically sealed capaitor unit by a hard moisture-excluding insulation 18 that is applied as a coating. Encapsulating coatings, selected from thermosetting epoxy resins having the desired insulating and moisture excluding characteristics, are usually quite brittle, separately. However, where the insulator wafer 16 is contained and encapsulated in the same coating 18 that encapsulates the capacitor section 10, the wafer and the insulating coating are each effective to modify the characteristics of the other. The capacitor section 10, wafer 16, and adjacent portions 12*a* of the lead wires 12 are immersed in a liquid epoxy coating which is then set as by baking. The limited space between the wafer and the capacitor section is filled with the coating material and the outer surface and edges of the wafer are coated, so that the wafer is surrounded and supported by the epoxy coating 18 which effectively "rigidizes" the wafer. The depth of immersion or dipping is carefully controlled to minimize the extent of the coating 18 on the lead wires 12 beyond the wafer 16. As a result of the hard coating 18 being present about the wafer, mechanical stresses imposed on the lead wires 12 have no tendency to twist or bend the wafer 16. Further, because of the restraint imposed by the relatively inextensible wafer, the leads have no tendency to crack the hard encapsulating coating 18. The effects of the mechanical stresses on the joints between the lead wires 12 and wound section 10 such as encountered during installation or during use of the capacitor, are minimized by the wafer 16 which is rigidized by the hard coating 18.

The above described method and construction may be utilized to great advantage in the production of other types of encapsulated components. The toughness of the wafer allows the selection and use of encapsulating coatings which might otherwise not be selected even though they have certain other desirable characteristics such as high insulation value, good thermal conductivity, or good moisture-excluding properties.

Although one embodiment of the invention has been shown and described, it will be apparent to those skilled in the art that various applications and modifications may be made of the novel features without departing from the spirit and scope of the invention.

What I claim is:

1. A miniature encapsulated component including an electrical component having a pair of spaced apart terminals, a wafer of tough, relatively inextensible insulating material positioned closely adjacent said component, said wafer having a pair of spaced-apart apertures, a pair of lead wires, said lead wires being secured to respective ones of said terminals and said lead wires extending through and being tightly received in respective apertures in said wafer, and a hard and relatively brittle insulating coating encapsulating said component, said wafer, and the portions of said wires extending through said wafer to the component terminals, said insulating coating filling the space between said component and said wafer and forming the exterior of the miniature encapsulated component.

2. An encapsulated capacitor, including a capacitor section having a pair of terminals, a pair of relatively long wires extending from said terminals, respectively, conductive bonding cement electrically and mechanically joining an end of each said wire to a respective terminal of the section, a wafer of tough insulating material of no more than sufficient thickness to be relatively inextensible disposed along and adjacent said section, said wafer having a pair of apertures spaced apart approximately the length of the section, said one of said wires extending through and tightly held mechanically in each of said holes, respectively, and a hard and relatively brittle insulating coating encapsulating said capacitor section, said wafer, and the portions of said wires extending through said wafer to the section terminals, said insulating coating filling the space between said component and said wafer and forming the exterior of the encapsulated capacitor.

3. An encapsulated capacitor, including a capacitor section having a pair of terminals, a pair of relatively long wires extending from said terminals, respectively, means joining an end of each said wire to a respective terminal of the section, a relatively thin and wide element of tough insulating material of sufficient thickness to be relatively inextensible disposed along and adjacent said section and leaving only a limited space therebetween, and said element, having a pair of spaced apart holes therethrough and said wires extending through and tightly received in said holes, respectively and a hard and relatively brittle insulating coating completely enclosing said capacitor section, and said element, and covering the portions of said wires extending through said element to the section terminals, said insulating coating filling the space between the element and the capacitor section whereby the element is rigidized and rendered effective to resist mechanical stresses imposed on said wires, said coating forming the exterior of the encapsulated capacitor.

4. An encapsulated miniature component, including an electrical component having a pair of electrical terminals, a pair of relatively long parallel wires extending from said terminals, respectively, means joining an end of each said wire to a respective terminal of the component, a wafer of tough, relatively inextensible insulation disposed along and adjacent said component between said terminals, said wafer having a pair of spaced apart apertures, said wires extending through and tightly held in said apertures, and a hard and relatively brittle insulating coating encasing said component and said wafer individually in common and covering the portions of said wires extending through said wafer to the section terminals and forming the exterior of the encapsulated miniature component, said insulating coating filling the space between said wafer and said component.

5. A capacitor in accordance with claim 3, wherein said capacitor section is of the wound extended-foil type and wherein said wires are joined to extended foil portions of the extended-foil capacitor section.

6. A capacitor section in accordance with claim 1 wherein said wafer is of sheet nylon.

References Cited by the Examiner

UNITED STATES PATENTS

| | | | |
|---|---|---|---|
| 1,619,201 | 3/1927 | Fried | 317—260 |
| 2,809,332 | 11/1957 | Sherwood | 264—272 |
| 2,850,687 | 9/1958 | Hammes | 264—272 |
| 2,956,219 | 10/1960 | Cianchi | 317—258 |
| 2,972,180 | 2/1961 | Gulton et al. | 29—25.42 |
| 3,028,656 | 4/1962 | Herbert | 29—25.42 |
| 3,046,452 | 7/1962 | Gellert. | |
| 3,047,782 | 7/1962 | McCarthy | 317—258 |
| 3,118,095 | 1/1964 | Baron | 317—261 |
| 3,122,679 | 2/1964 | Kislan. | |

FOREIGN PATENTS

| | | |
|---|---|---|
| 913,938 | 6/1954 | Germany. |

JOHN F. BURNS, *Primary Examiner.*

JOHN P. WILDMAN, *Examiner.*